(12) United States Patent
Van Herpen et al.

(10) Patent No.: US 7,750,326 B2
(45) Date of Patent: Jul. 6, 2010

(54) LITHOGRAPHIC APPARATUS AND CLEANING METHOD THEREFOR

(75) Inventors: Maarten Marinus Johannes Wilhelmus Van Herpen, Heesch (NL); Vadim Yevgenyevich Banine, Helmond (NL); Derk Jan Wilfred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 367 days.

(21) Appl. No.: 11/150,466

(22) Filed: Jun. 13, 2005

(65) Prior Publication Data

US 2006/0278833 A1 Dec. 14, 2006

(51) Int. Cl.
*H05G 2/00* (2006.01)
(52) U.S. Cl. .............................. 250/504 R; 250/492.1; 250/492.2; 250/493.1
(58) Field of Classification Search .............. 250/492.1, 250/492.2, 493.1, 504 R; 355/30, 53, 57
See application file for complete search history.

(56) References Cited

U.S. PATENT DOCUMENTS

| | | | | |
|---|---|---|---|---|
| 3,853,386 | A * | 12/1974 | Ritter et al. ................. | 359/588 |
| 6,566,667 | B1 | 5/2003 | Partlo et al. ................. | 250/504 |
| 6,968,850 | B2 * | 11/2005 | Chan et al. .................. | 134/1.1 |
| 7,193,228 | B2 * | 3/2007 | Bowering et al. ....... | 250/504 R |
| 7,196,342 | B2 * | 3/2007 | Ershov et al. ........... | 250/504 R |
| 2002/0084425 | A1 * | 7/2002 | Klebanoff et al. ........ | 250/492.1 |
| 2003/0043456 | A1 * | 3/2003 | Singh ......................... | 359/359 |
| 2004/0007246 | A1 * | 1/2004 | Chan et al. ................. | 134/1.1 |
| 2004/0011381 | A1 | 1/2004 | Klebanoff et al. .............. | 134/2 |
| 2004/0165160 | A1 * | 8/2004 | Van Beek et al. ............. | 355/30 |
| 2006/0289811 | A1 * | 12/2006 | Van Herpen et al. ..... | 250/504 R |
| 2007/0114470 | A1 * | 5/2007 | Bowering ............... | 250/504 R |
| 2007/0125964 | A1 * | 6/2007 | Van Herpen et al. ..... | 250/492.2 |

FOREIGN PATENT DOCUMENTS

| | | | |
|---|---|---|---|
| EP | 1065568 A2 | | 1/2001 |
| EP | 1429189 A1 | * | 6/2004 |
| WO | WO 2005/010617 A2 | | 2/2005 |

OTHER PUBLICATIONS

Smith ("The surface recombination of H atoms and OH radicals," J. Chem. Phys. 11, 110-125, 1943).*
Feigl, et al. "Heat resistance of EUV multilayer mirrors for long-time applications" Microelectronic Engineering 57-58 (2001) 3-8.*
European Examination Report issued on Jan. 20, 2009 in European Application No. 06 747 569.9.

* cited by examiner

*Primary Examiner*—David A Vanore
*Assistant Examiner*—Michael Maskell
(74) *Attorney, Agent, or Firm*—Pillsbury Winthrop Shaw Pittman LLP

(57) ABSTRACT

A lithographic apparatus is disclosed. The apparatus includes a source for supplying hydrogen radicals, a guide for use in conjunction with the source, for directing hydrogen radicals to an application surface to be targeted by the hydrogen radicals. The guide is provided with a coating having a hydrogen radical recombination constant of less than 0.2. In this way, the radicals can be transported with reduced losses and are able to better interact with remaining contaminants on application surfaces, such as mirror surfaces.

21 Claims, 8 Drawing Sheets

LITHOGRAPHIC APPARATUS AND CLEANING METHOD THEREFOR

FIELD

The present invention relates to a lithographic apparatus and cleaning method therefor.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of one, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In current designs for lithographic apparatus operating in the EUV range (with wavelengths typically of 5-20 nm) of the electromagnetic spectrum, highly reflective elements are typically provided in order to condition and pattern a beam for transferring a pattern from a patterning device onto a substrate. This part of the electromagnetic spectrum is sensitive to transmission losses since the radiation is easily absorbed by most surfaces. In order to increase the reflectivity, mirror elements have been developed typically comprising a ruthenium top layer (for example Ru-capped multi-layer mirrors and Ru grazing incidence mirrors). Furthermore, the sources that are used to produce such EUV radiation are typically plasma sources, wherein current designs in particular use a tin source. These plasma sources have a tendency to produce, in addition to EUV radiation, a variety of debris particles, which may, without appropriate measures, migrate into the system and cause contamination and malfunction.

In particular, tin contamination from the plasma source will deposit on mirror elements and cause serious loss of reflectivity of the mirror. This is prevented by contraptions to catch the debris before it can do any harm. However, these contraptions can have a certain fail ratio. Typically, such a contraption is a so-called foil trap which is designed to trap debris particles in substantially aligned foil plates. Downstream, relative to the direction of EUV radiation, a collector is typically arranged to collect an optimal portion of radiation coming out of the EUV-source. Such a collector is typically an arrangement of mirror elements, which use a grazing incidence reflection for collecting and guiding incident radiation into a beam of EUV radiation. In particular, for the mirror elements of the collector, but also for other mirror elements which are critically subject to contamination, it is therefore desirable to provide cleaning techniques to clean these mirror elements from contamination. One of such techniques is so called hydrogen cleaning. In this method, in particular in combination with a tin source, hydrogen radicals react with tin to form gaseous tin-hydrides ($SnH_4$). Another technique is halogen cleaning. Also, a combined technique may be used, in particular, wherein tin oxides are reduced to tin using hydrogen, and where the thus formed tin is removed using halogen cleaning. However it has been found that for typical mirror elements, in particular comprising ruthenium, the cleaning rate drops dramatically for very thin tin deposits. Such thin contaminant deposits may degrade the transmission of the EUV mirrors and may be hard to remove. For hydrogen cleaning, removal of such thin deposits may lead to unacceptable down time for the lithographic apparatus.

SUMMARY

It is desirable to provide a lithographic apparatus and cleaning method therefor that efficiently deals with contaminant removal and with which traces of contaminants can be removed, even if they are very thin layered. In particular, it is desirable to provide a lithographic apparatus wherein hydrogen cleaning is optimally effective for cleaning mirror elements within an acceptable time frame.

Accordingly, there is provided a lithographic apparatus. In particular, according to the invention, there is provided an EUV lithographic apparatus comprising: a radiation source for generating EUV radiation; a source for supplying hydrogen radicals; a guide for use in conjunction with said hydrogen radical source, for directing hydrogen radicals to an application surface to be targeted by said hydrogen radicals; wherein said guide is provided with a coating having a hydrogen radical recombination constant of less than 0.2. Typically, the guide can comprise a mirror element for directing EUV radiation towards a substrate to be targeted by an EUV projection beam.

In another aspect of the invention, there is provided a method of cleaning contamination from an EUV mirror element, comprising: providing said mirror element with a coating having a hydrogen radical recombination constant of less than 0.2; and providing hydrogen radicals to said mirror element in order to etch said contamination from said mirror element.

In another aspect of the invention, there is provided a method of providing hydrogen radicals from a source to an application surface, comprising: providing a guide for directing said radicals from said source towards said application surface; wherein said guide is provided with a coating having a hydrogen radical recombination constant of less than 0.2.

In another aspect of the invention, there is provided a method of protecting an EUV mirror element from hydrogen radicals, comprising: providing said mirror element with a coating having a hydrogen radical recombination constant of less than 0.2; and providing hydrogen radicals to said mirror element.

In another aspect of the invention, there is provided a manufacturing method for manufacturing a grazing incidence mirror element for directing an EUV beam towards a substrate to be targeted by an EUV projection beam, comprising: providing a mirror element and annealing said mirror element to a temperature of at least 300° C.

In the context of this invention, a coating is a substantially uniform, substantially homogenous layer of substantially uniform thickness, which entirely covers a surface of interest to be coated for directing purposes or cleaning purposes. The coating may be applied with any known technique including hot filament deposit, sputtering or chemical vapour deposition processes. Throughout the text unless indicated otherwise, the terms "hydrogen" and "hydrogen radicals" imply to comprise their isotopes as well, in particular, deuterium.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
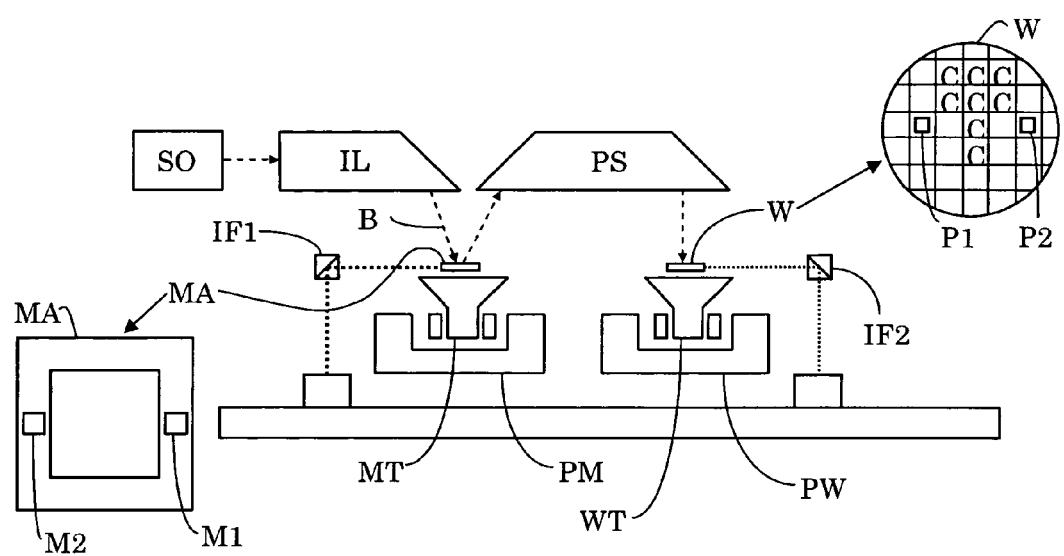
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases the radiation beam may be passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system, if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In FIG. 1, the source SO is typically a plasma source, which may be a tin source or a Xe source. The plasma source SO generates debris, in addition to EUV radiation. To protect the lithographic system from that debris the EUV lithographic apparatus, in particular, mirror elements in the source SO, illumination system IL and/or the projection system PS may comprise mirror elements designed according to an embodiment of the invention for reflecting EUV radiation and for conditioning and patterning an EUV beam and/or for projecting such an EUV beam towards a substrate W.

Figure 2:
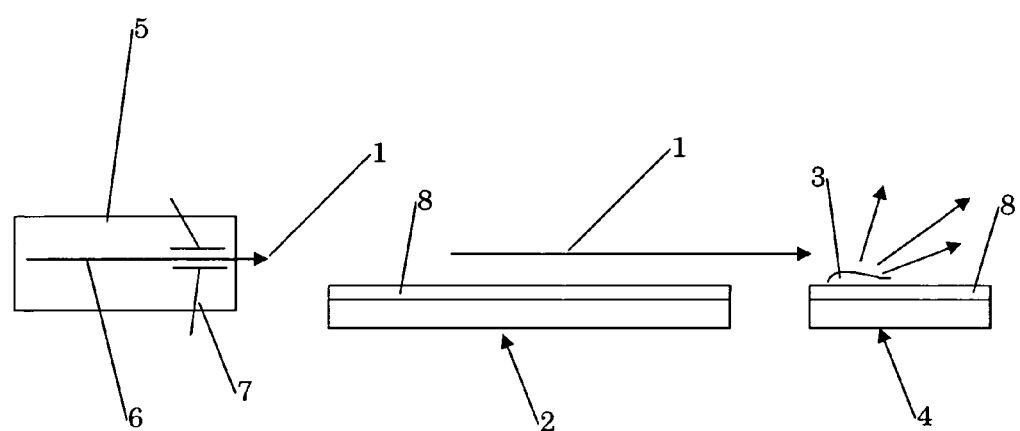
FIG. 2 depicts a schematic illustration of a portion of the apparatus of FIG. 1.

FIG. 2 shows an embodiment of the invention for directing hydrogen radicals 1 along a guide 2 and/or applying hydrogen radicals for purposes of cleaning contaminants 3 on a surface, typically a mirror surface 4 comprised in the source system SO, the illumination system IL and/or the projection system PS. Currently, these surfaces mostly comprise a Ru top structure. To this end, there is provided a source 5 for hydrogen radicals supply; a guide structure 2 for use in conjunction with said source 5, for directing hydrogen radicals 1 to an application surface structure 4 to be targeted by said hydrogen radicals 1. Typically, the hydrogen radical 1 supply is provided by guiding hydrogen 6 along an oscillating field electrode 7, or a hot filament or the like. This causes the hydrogen gas 6 to dissociate into hydrogen radicals 1. The guide structure 2 element and/or the mirror element 4 are provided with a coating 8 having a hydrogen radical recombination constant which is low, typically much lower than that of Ru which has a recombination constant in the order of 2.

Information on recombination coefficients can be found in the literature, in particular W. V. Smith, "The surface recombination of H atoms and OH radicals", J. Chem. Phys. 11, 110-125 (1943) and B. J. Wood, H. Wise, "Kinetics of Hydrogen Atom Recombination on Surfaces", J. Phys. Chem. 65, 1976-1983 (1961).

The following Table 1 illustrates a number of materials and their respective surface recombination coefficients for hydrogen radicals.

TABLE 1

| Material | Surface recombination coefficient |
| --- | --- |
| Syrupy phosphoric acid | $2 \times 10^{-6}$ |
| KOH | $2 \times 10^{-6}$ |
| Metaphosphoric acid | $2 \times 10^{-5}$ |
| KCl | $2 \times 10^{-5}$ |
| Quartz (room temperature) | $7.0 \times 10^{-4}$ |
| Quartz (300-500° C.) | $3 \times 10^{-3}$ |
| Pyrex glass | $4 \times 10^{-3}$ |
| $K_2CO_3$ | >0.05 |
| W | 0.06 |
| $K_2SiO_3$ | 0.07 |
| Sodium Phosphate | >0.07 |
| Pd | 0.08 |
| Cu | 0.1 |
| Ni | 0.2 |
| $Al_2O_3$ | 0.33 |

TABLE 1-continued

| Material | Surface recombination coefficient |
|---|---|
| Ti | 0.4 |
| ZnO.Cr$_2$O$_3$ | 0.6 |
| Pt | 1 |

Experiments indicate that coatings having a recombination coefficient lower than that of tin (0.4) have beneficial results in terms of transport lifetime of hydrogen radicals and surface cleaning rate. Such coatings are usually found amongst dielectrics, but not necessarily only dielectrics.

The following two reactions describe the generation of hydrogen radicals on a filament:

$$H_2 + S^* \leftrightarrows H + SH \qquad (1)$$

$$SH \leftrightarrows H + S^* \qquad (2)$$

Reaction (1) describes the dissociative adsorption of H$_2$ on an active filament surface site (S*). In reverse direction, reaction (1) describes the H atom recombination on a hydrogen-terminated filament surface. Reaction (2) describes the desorption and adsorption of atomic hydrogen onto the filament surface. In order to produce gas-phase hydrogen atoms, they first need to be produced with reaction (1) and next they need to be desorbed with reaction (2). Changes in the temperature of the filament will influence the H atom filament production rate by affecting the mean lifetime of chemisorbed species on the filament surface, together with its energetic influence on the H atom formation reaction scheme. The temperature of the filament also affects the fraction of available S* and the local gas phase H atom number density which, in turn, influences the fraction of active sites with the reverse of reaction (2). Note that the local H atom number density is controlled by the diffusion rate of hydrogen radicals and therefore in many cases the production of H radicals is diffusion-limited.

The lifetime of hydrogen radicals is limited by two reactions.

The first loss mechanism for hydrogen atoms is recombination on the walls. The reactions for recombination look the same as reactions (1) and (2), with the only difference that in this case the atoms react with the walls of the vacuum system (Sw) instead of the filament:

$$H + Sw^* \rightarrow SwH \qquad (3)$$

$$H + SwH \rightarrow H_2 + Sw^* \qquad (4)$$

Reaction (3) describes the adsorption of a hydrogen atom onto the wall surface and reaction (4) shows the H atom recombination on a hydrogen-terminated wall surface. The recombination rate at the walls can be described in terms of recombination γ for each atom striking the surface.

The second loss mechanism is three-body recombination and this is described by reaction (5):

$$H + H + M(H_2) \rightarrow H_2 + M(H_2) \qquad (5)$$

In this reaction two hydrogen atoms recombine into a hydrogen molecule. The energy that is released with the recombination is transferred to a third molecule, which can for example be a hydrogen molecule M(H$_2$). The rate with which this reaction occurs depends on the (partial) pressure of H atoms [H] and the pressure of potential third bodies.

Figure 3:
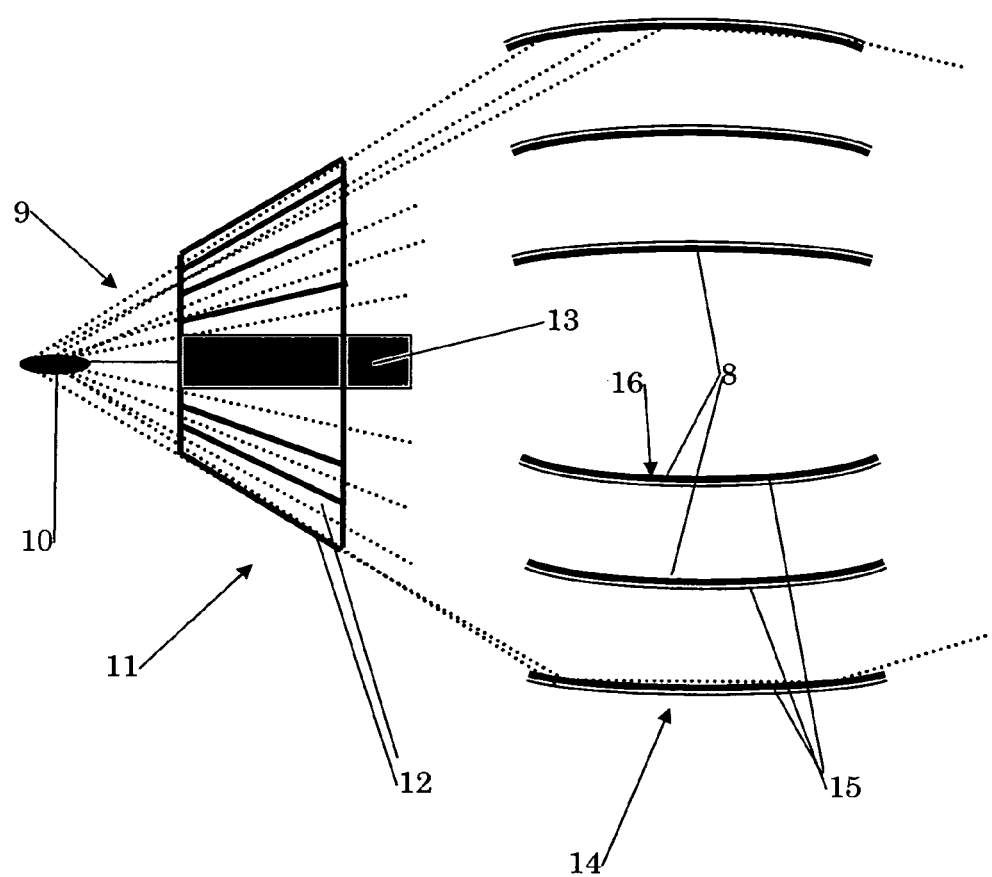
FIG. 3 depicts a radiation system of the apparatus of FIG. 1.

FIG. 3 shows a basic configuration for a radiation system according to an embodiment of the invention. In the figure, the dashed lines represent EUV radiation 9 coming from an EUV source 10, typically a discharge based or laser induced plasma source such as a tin source or Xe source, which are known per se. Here, a foil trap 11 is illustrated which functions as a contamination barrier for trapping contaminant material coming from the radiation source 10. To this end, the foil trap 11 is provided with a plurality of closely packed foil plates 12, typically arranged at a distance of 0.3-5 mm (normally about 2 mm), whereas the foil plates 12 have a length dimension in substantially radial direction from the source 10 of typically a few cm. Preferred embodiments have lengths ranging from 1.5-5 cm. Along a central axis, the source 10 is shielded by a heat shield 13.

Typically, the foil plates 12 are stacked in a radial configuration. As is schematically indicated in FIG. 3, in downstream direction of the radiation, a collector element 14 is present having a converging power for collecting and converging said EUV radiation from said EUV source 10 to further EUV optics. Such a collector element 14 is typically cylinder symmetric along a central axial direction and comprises concentrically curved shell formed mirror elements 15 that are stacked at a distance ranging substantially between 1 and 7 cm. According to the invention, the mirror elements 15 of the collector, in particular, the reflective surfaces 16 thereof, are coated with the coating 8 described with reference to FIG. 2.

Figure 4:
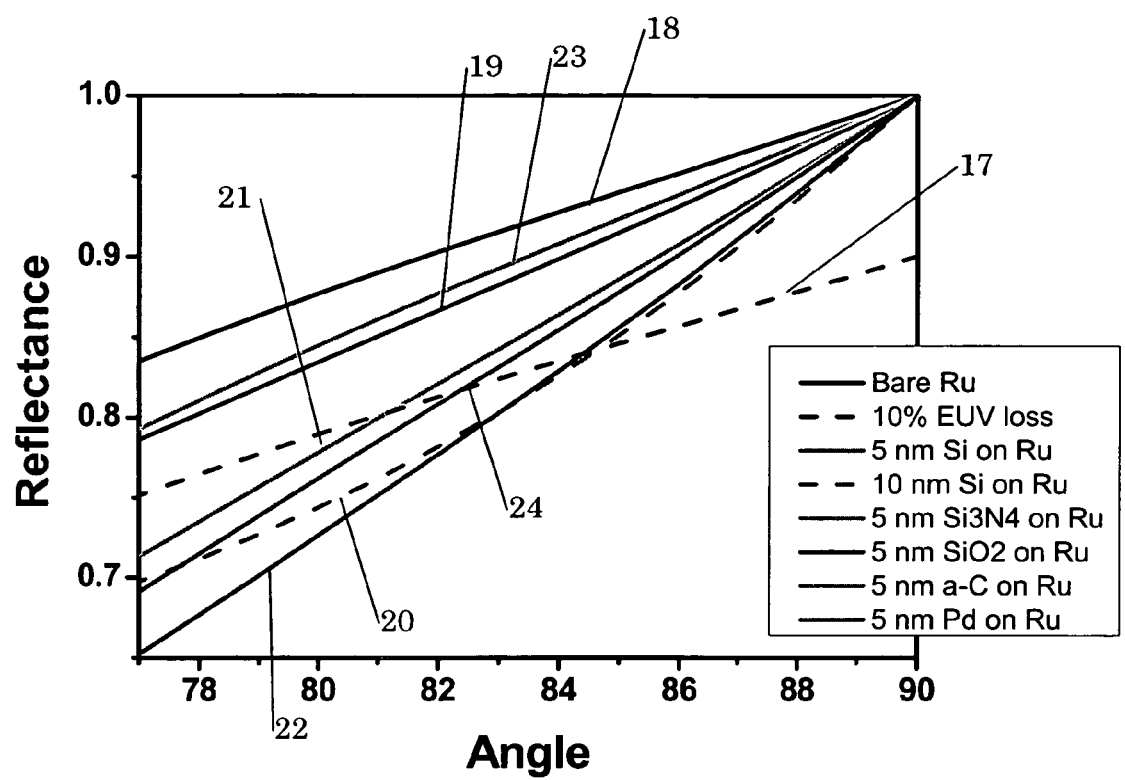
FIG. 4 shows calculated transmission losses for a selected number of coating materials for a component of the apparatus of FIG. 1.
Figure 7:
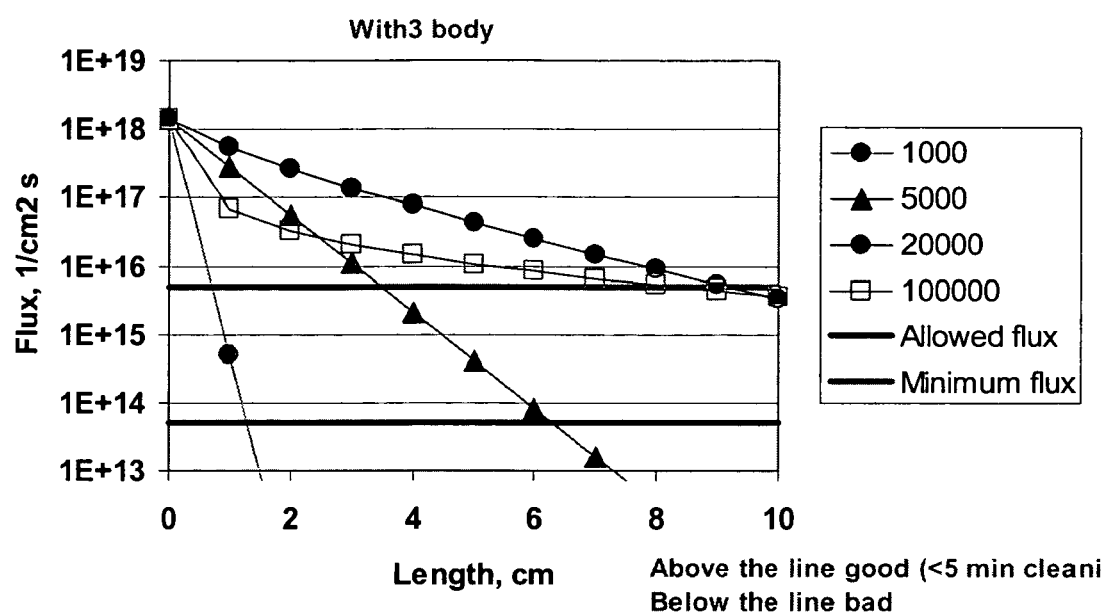
FIG. 7 shows a calculation of the flux of hydrogen radicals as a function of distance for an uncoated guide.

FIG. 4 shows a diagram illustrating a calculated loss of reflectance of the inventive coating. Typically, the coating will provide some transmission losses in comparison with an ideally clean and uncoated Ru mirror surface. However, these losses are acceptable. Reference is further made to FIG. 7 where practical reflective behaviour is discussed.

The relative loss in reflectance (Y-axis) is illustrated in relation to an angle of incidence (X-axis) relative to normal incidence on the Ru mirror surface. It is found that typically the losses are less than 10% (see curve 17). In particular, there is illustrated a reflection curve for bare Ru (curve 18), a 5 nm Si layer on Ru (curve 19), a 10 nm Si layer on Ru (curve 20), a 5 nm Si$_3$N$_4$ layer on Ru (curve 21), a 5 nm SiO$_2$ layer on Ru (curve 22), a 5 nm a-C layer on Ru (curve 23), and a 5 nm Pd layer on Ru (curve 24).

Preferably, this coating should be able to withstand treatments with hydrogen radicals and it should have a high cleaning rate for Sn with hydrogen radicals.

In an experiment, Si$_3$N$_4$ was tested as coating material on a Ru mirror element. First, the cleaning rate of Sn on Si$_3$N$_4$ was determined, using a ~10 nm thick layer of Sn on a thick layer of Si$_3$N$_4$, deposited onto a substrate. The results of a 15 seconds treatment are shown in Table 2. From this table can be seen that essentially all Sn had been removed from the sample during the treatment.

TABLE 2

Etch results for Si$_3$N$_4$ on Ru.

| Sample | Sn (μg/cm$^2$) | Sn (nm) |
|---|---|---|
| RuSi$_3$N$_4$ before treatment | 9.3 | 12.7 |
| RuSi$_3$N$_4$ after treatment | 0.02 | 0.03 |

From this Table 2 follows that a very good cleaning ratio may be achieved using this coating layer.

Next, the resistance of Si$_3$N$_4$ to hydrogen radicals was tested. In order to test the resistance of Si$_3$N$_4$ to hydrogen radicals, the coating was exposed during two treatments of 15 seconds each, during which the temperature ranged from 15-50° C. Using an optical method, the thickness of the Si$_3$N$_4$ layer was measured before and after treatment. It was found that no detectable amount of $Si_3N_4$ had been removed (less than 0.1 nm). This demonstrates that $Si_3N_4$ has good resistivity against treatment with hydrogen radicals.

Figure 5:
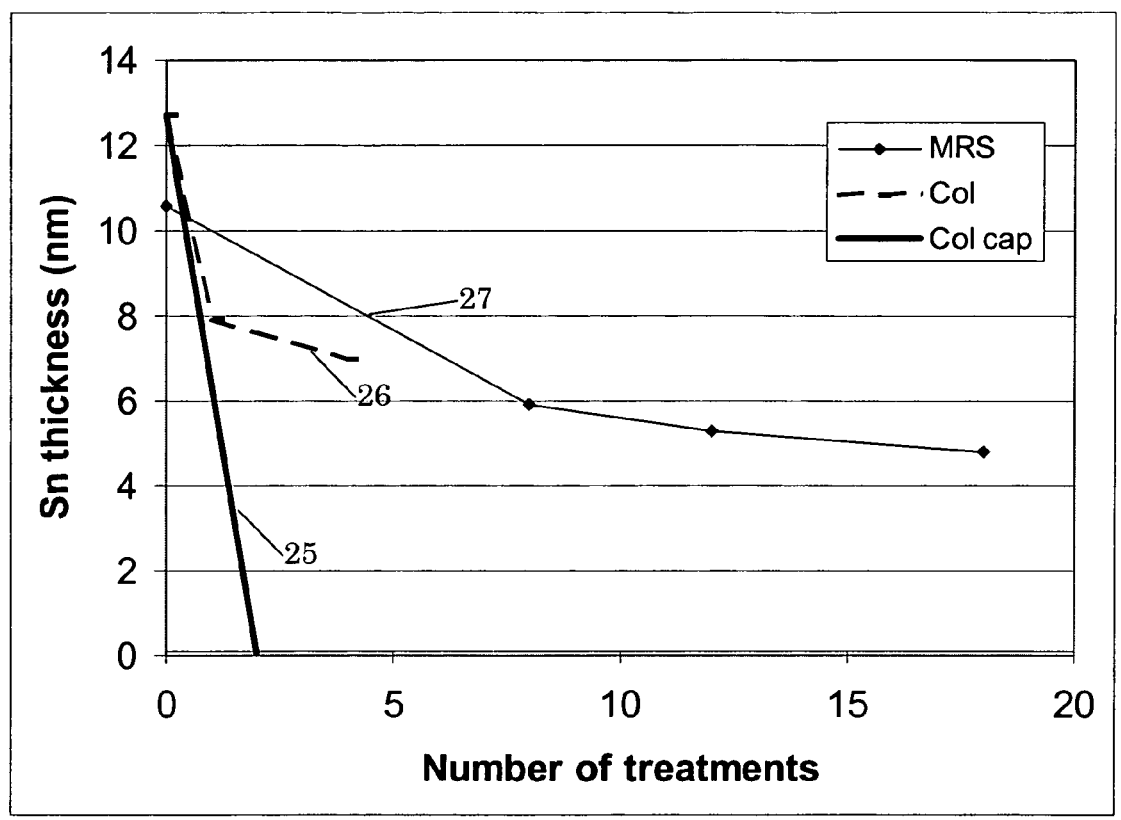
FIG. 5 shows a cleaning rate of a coated collector mirror of the apparatus of FIG. 1, as seen in comparison to the cleaning rate with a normal collector mirror.

In a further experiment a collector mirror with 2 nm $Si_3N_4$ and 10 nm Sn was exposed to hydrogen radicals for 2 treatments of 15 seconds. In FIG. 5 is shown the cleaning rate of a coated collector mirror (curve 25) in comparison to the cleaning rate with a normal collector mirror (curve 26). For comparison, a cleaning rate of a bare Ru sample MRS (curve 27) is shown. From this figure can be seen that the cleaning rate is greatly increased and that all Sn can be removed from the mirror. In contrast, on an uncoated Ru mirror, a small Sn layer of approximately 5 nm remains attached to the mirror surface with no significant resulting etching effect, even after 15 treatments.

Figure 6:
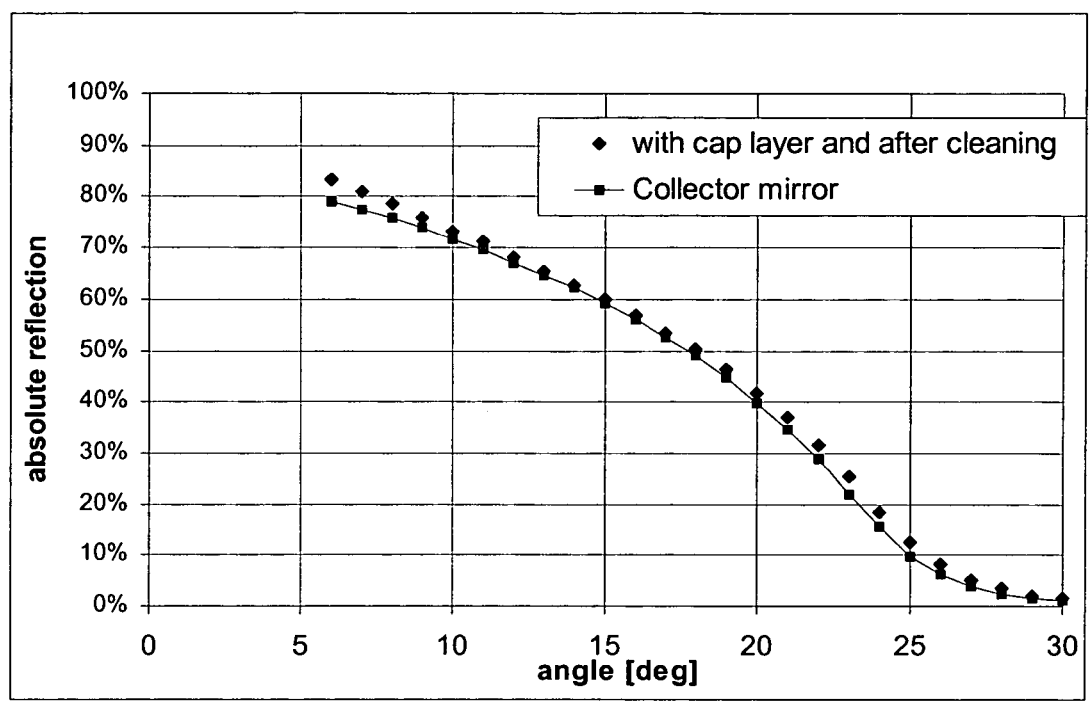
FIG. 6 shows a measured EUV reflectivity of a cleaned sample of a mirror of the apparatus of FIG. 1, in comparison with a normal collector mirror.

Next, the EUV reflectivity of the mirror after cleaning 10 nm tin was tested using an EUV reflectometer, compared to a normal uncoated mirror. In FIG. 6 can be seen that the EUV reflectivity of the cleaned sample is similar to or even better than the EUV reflectivity of a normal collector mirror, even though there is 2 nm of $Si_3N_4$ on the cleaned sample. Experiments indicate that the reflectivity is enhanced by the heat treatment of application of the coating, which occurs at about 300° C. From this can be concluded that the cleaning treatment does not have detectable negative effects on the EUV reflectivity of the collector mirror.

In addition, it was found that the uncoated Ru mirror was more sensitive to hydrogen cleaning. From a test it was found that cracks were formed in the Ru surface which can seriously impact the reflectivity and economic lifetime. In contrast, the coated mirror, in addition to providing a better cleaning rate, showed no degradation of the Ru surface that was coated by the $Si_3N_4$. It is concluded that this coating can be used as a protective coating against degradation from hydrogen radicals.

Referring to the discussion above regarding recombination of hydrogen radicals and dissociation of the hydrogen atoms, a number of restrictions apply for using an optimal pressure regime in actual embodiments.

In particular, due to three-body recombination of hydrogen radicals into hydrogen molecules, the pressure in the system should be as low as possible to prevent too many losses due to three-body recombination since the efficiency of this process is limited by the total pressure and the number of hydrogen radicals that are present in the gas mixture. However, in the low pressure regimes, a second loss mechanism takes over, which is recombination on the walls. Here, hydrogen radicals are recombining in the presence of a surface. The recombination efficiency depends on the type of surface material as discussed. In particular, the recombination constant is very high for metal surfaces as discussed. Taking this mechanism into account, the amount of losses due to this mechanism can be limited by making the pressure in the system as high as possible (in order to make the process diffusion limited).

In addition, only in certain pressure regimes, adequate gas flow speeds can be provided due to technical limitation of the pumping systems. Due to these two challenges there currently appear to be only two viable pressures that can be used: a high pressure regime of typically more than 1 bar. Here the pressure is very high and therefore a compressor should be used. The problem with this method is that the gas usage is very high; or an intermediate pressure regime of typically higher than 100 mbar (also high gas usage); or a low pressure regime: where due to low pressure (typically less than 1 mbar) the amount of three-body recombination is limited. However, there is still some loss due to this and also losses on the walls may become significant, because diffusion goes relatively fast. The problem with this method is that the gaseous Sn-containing molecules (or $H_2O$ in the case of Sn-oxide reduction for halogen cleaning) might be only slowly transported out of the collector and this might increase the risk of redeposition of these molecules.

With the coating layer of the present invention, the intermediate pressure regime becomes within reach since the loss of hydrogen radicals on the walls is limited. FIG. 7 shows a calculation of the flux of hydrogen radicals as a function of distance within the collector (as generated from a typical source of hydrogen radicals at a typical conversion efficiency of 0.5%). In order to reduce losses of hydrogen radicals, the calculation was done using a Ru surface on one side, and a glass surface on the other side. Losses of hydrogen radicals are acceptable if the flux of hydrogen radicals is high enough up to a distance of about 10 cm (indicated with the upper horizontal line, "Allowed flux", in FIG. 7). From the figure can be seen that at relatively high pressures (greater than 10000 Pa=~100 mbar), the losses of hydrogen radicals are acceptable. However, for pressures such as 5000 Pa or 1000 Pa, the losses of hydrogen radicals might be too significant to be able to cover sufficient distance.

Figure 8:
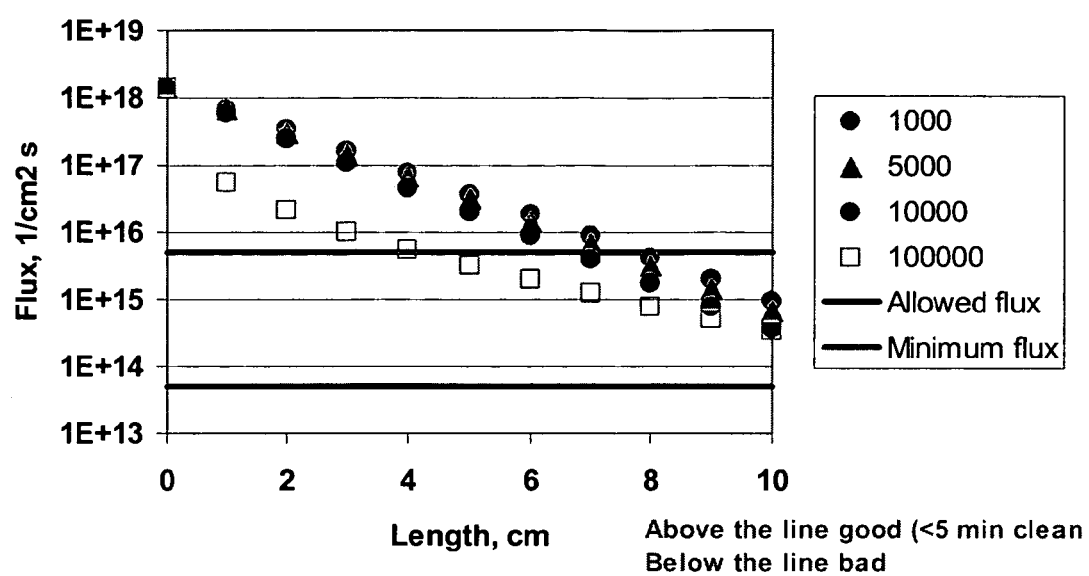
FIG. 8 shows a calculation of the flux of hydrogen radicals as a function of distance for a coated guide of the apparatus of FIG. 1.

In contrast, FIG. 8 shows the same calculation as in FIG. 7, but now with a recombination constant of gamma=0.001. From this figure can be seen that all pressures are now suitable and therefore also the pressure range of 1-10 mbar becomes an option. The situation can be further improved by increasing the conversion efficiency of the source that is used.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An EUV lithographic apparatus comprising:
   a radiation source configured to generate EUV radiation;
   a hydrogen radical source configured to supply hydrogen radicals; and
   a guide for use in conjunction with and configured to receive hydrogen radicals from said hydrogen radical source, and configured to direct said hydrogen radicals to an application surface, the application surface being separate from the hydrogen radical source and being separate from the guide;
   wherein said guide is provided with a coating having a hydrogen radical recombination constant of less than 0.2, and wherein an etch rate of said coating is less than twenty times an etch rate of tin at a predetermined hydrogen radical partial pressure.

2. An EUV lithographic apparatus according to claim 1, wherein said guide, in an operating condition of the EUV lithographic apparatus, interacts with EUV radiation.

3. An EUV lithographic apparatus according to claim 1, wherein said guide comprises a mirror element configured to direct EUV radiation towards a substrate to be targeted by an EUV projection beam.

4. An EUV lithographic apparatus according to claim 3, wherein said mirror element is an EUV collector.

5. An EUV lithographic apparatus according to claim 1, wherein said recombination constant is less than 0.01.

6. An EUV lithographic apparatus according to claim 1, wherein said recombination constant is less than 0.001.

7. An EUV lithographic apparatus according to claim 1, wherein said coating is hydrogen radical resistant.

8. An EUV lithographic apparatus according to claim 1, wherein the etch rate of said coating is less than ten times the etch rate of tin at the predetermined hydrogen radical partial pressure.

9. An EUV lithographic apparatus according to claim 1, wherein said guide comprises a material having a recombination constant higher than 0.5.

10. An EUV lithographic apparatus according to claim 9, wherein said guide comprises ruthenium.

11. An EUV lithographic apparatus according to claim 1, wherein said coating comprises a Si compound.

12. An EUV lithographic apparatus according to claim 11, wherein said coating comprises a SiN compound.

13. An EUV lithographic apparatus according to claim 12, wherein said coating comprises $Si_3N_4$.

14. An EUV lithographic apparatus according to claim 1, wherein said coating has a thickness of 0.5-2.5 nm.

15. An EUV lithographic apparatus according to claim 14, wherein said coating has a thickness of 0.8-1.2 nm.

16. A method of cleaning contamination from an EUV mirror element, comprising:
   guiding a flow of hydrogen radicals from a source that is separate from said mirror element to said mirror element in order to etch said contamination from said mirror element, wherein said mirror element has a coating having a hydrogen radical recombination constant of less than 0.2, and wherein a pressure regime of hydrogen/hydrogen radicals ranges between 1-20 mbar.

17. A method according to claim 16, wherein said contamination comprises tin, or said mirror element comprises Ru or both.

18. A method according to claim 16, wherein the cleaning method further comprises providing halogens for halogen cleaning purposes.

19. A method of providing hydrogen radicals from a source to an application surface that is separate from the source, comprising:
   directing said hydrogen radicals from said source towards said application surface with a guide,
   wherein said guide is provided with a coating having a hydrogen radical recombination constant of less than 0.2, and wherein an etch rate of said coating is less than twenty times an etch rate of tin at a predetermined hydrogen radical partial pressure.

20. A method of protecting an EUV mirror element from hydrogen radicals, comprising:
   providing hydrogen radicals to said mirror element, wherein said mirror element has a coating having a hydrogen radical recombination constant of less than 0.2,
   wherein a pressure regime of the hydrogen radicals ranges between 1-20 mbar.

21. A manufacturing method for manufacturing a grazing incidence mirror element for directing an EUV beam towards a substrate to be targeted by an EUV projection beam, comprising:
   providing a mirror element and annealing said mirror element to a temperature of at least 300° C., the annealed mirror configured to be used as a grazing incidence mirror element for directing the EUV beam; and
   coating said mirror element with a coating having a hydrogen radical recombination constant of less than 0.2, wherein an etch rate of said coating is less than twenty times an etch rate of tin at a predetermined hydrogen radical partial pressure.

* * * * *